United States Patent
Morgenstern et al.

(10) Patent No.: US 11,048,576 B2
(45) Date of Patent: Jun. 29, 2021

(54) SELF-VERIFICATION OF OPERATING SYSTEM MEMORY MANAGEMENT

(71) Applicant: International Business Machines Corporation, Armonk, NY (US)

(72) Inventors: Harris Morgenstern, Wappingers Falls, NY (US); Robert Miller, Jr., Poughkeepsie, NY (US); Tracy Christie, Wappingers Falls, NY (US); Joseph Danieli, Pleasant Valley, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 140 days.

(21) Appl. No.: 16/390,073

(22) Filed: Apr. 22, 2019

(65) Prior Publication Data

US 2020/0334094 A1    Oct. 22, 2020

(51) Int. Cl.
*G06F 11/07* (2006.01)
(52) U.S. Cl.
CPC ........ *G06F 11/0793* (2013.01); *G06F 11/073* (2013.01); *G06F 11/079* (2013.01)
(58) Field of Classification Search
CPC .. G06F 11/073; G06F 11/079; G06F 11/0793; G06F 11/3604; G06F 11/3612; G06F 11/3688; G06F 11/3692
See application file for complete search history.

(56) References Cited

U.S. PATENT DOCUMENTS

| 6,182,246 | B1* | 1/2001 | Gregory | G06F 11/263 |
| | | | | 714/38.14 |
| 8,418,000 | B1* | 4/2013 | Salame | G06F 11/3684 |
| | | | | 714/38.1 |
| 9,336,100 | B2* | 5/2016 | Kolassery | G06F 11/0778 |
| 9,594,680 | B1* | 3/2017 | Bussa | G06F 11/263 |
| 9,747,187 | B2 | 8/2017 | Fink et al. | |
| 2003/0046029 | A1 | 3/2003 | Wiener et al. | |
| 2011/0055813 | A1 | 3/2011 | Calendino et al. | |
| 2013/0024846 | A1 | 1/2013 | Lewis et al. | |
| 2015/0095888 | A1 | 4/2015 | Tripp | |

OTHER PUBLICATIONS

IBM Corporation "MVS Programming: Authorized Assembler Services Guide" Version 2 Release 3, SA23-1371-30 Jul. 17, 2017. pp. 167-202.
Khurshid et al., "Test Input Generation with Java PathFinder: Then and Now (Invited Talk Abstract)" Proceedings of the 27th ACM SIGSOFT International Symposium on Software Testing and Analysis. ACM, 2018. pp. 1-2.
Steegmans et al. "Black & White Testing: Bridging Black Box Testing and White Box Testing" Software Testing: Beheers Optimaal de Risico's van IT in uw Business. 2004. pp. 1-12.

* cited by examiner

*Primary Examiner* — Joseph R Kudirka
(74) *Attorney, Agent, or Firm* — Cantor Colburn LLP; Teddi Maranzano

(57) ABSTRACT

A computing system includes a processor in signal communication with a memory unit. A test case and recovery (TCR) system is configured to operate in a first mode to perform recovery and repair operations on the memory unit in response to detecting an error event and a second mode to perform test case analysis and verification of an operating system stored in the memory unit in response to being called by a test case.

15 Claims, 3 Drawing Sheets

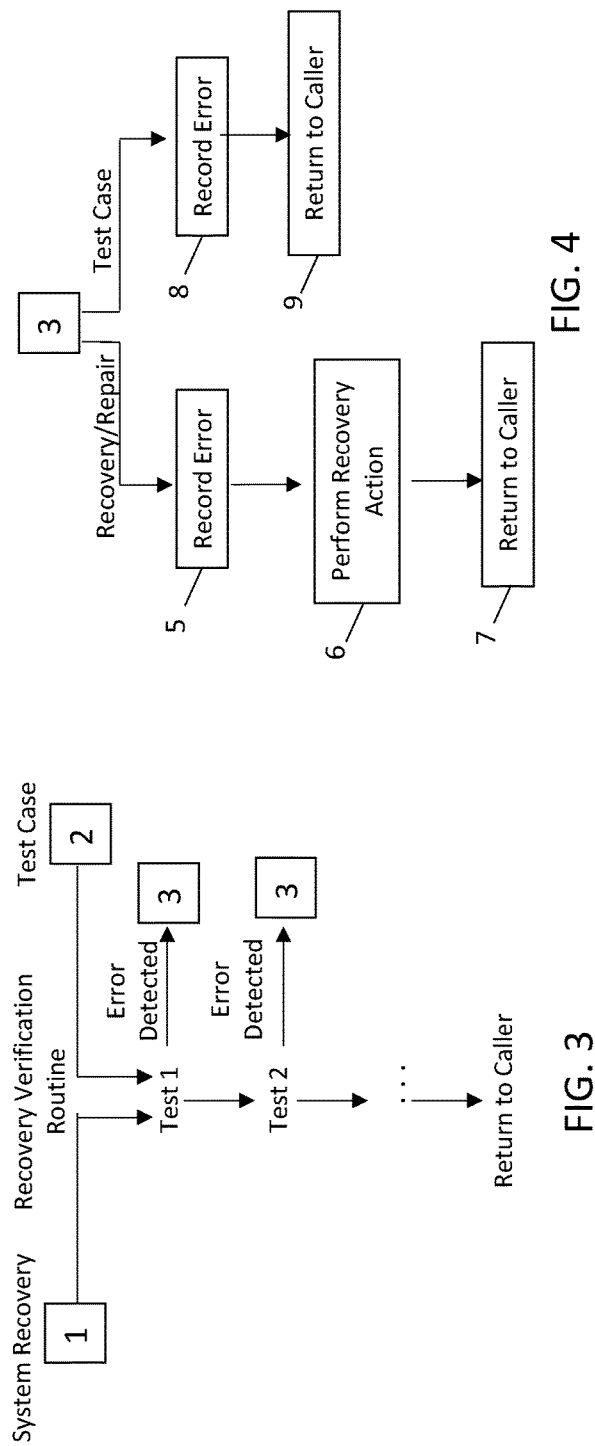
FIG. 4
FIG. 3
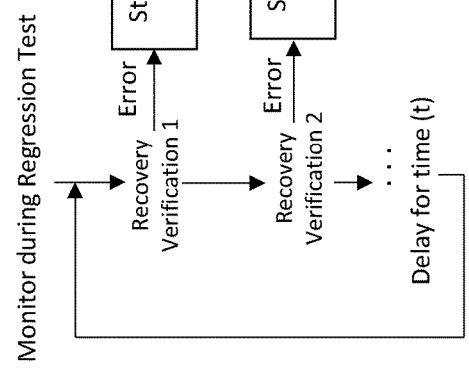
FIG. 5

SELF-VERIFICATION OF OPERATING SYSTEM MEMORY MANAGEMENT

BACKGROUND

The present techniques relate to computer systems, and more particularly, to testing and recovery schemes implemented in computer systems.

The process of software development requires several phases which include different types of testing including unit testing, function testing and one or more different types of system testing, depending on the complexity of the product. Unit testing refers to verifying the correctness of small units of code working in isolation and requires access to the source code. Function testing verifies that a single software function or component provides the correct results given some specified input. System testing verifies that several different components interact correctly.

As the focus of the test becomes broader, it becomes more difficult to diagnose or even detect problems. In particular, the function or system tester may not even have access to the source code. When the tester does not have access to the source code, the test effort is referred to as black box testing. On the other hand, unit test which is typically performed by the developer of the code is typically a white box effort where the tester has access to the source code. While the white box approach may make the test effort more focused, it comes at certain costs, including opening up the internal states of the system under test. This means that the test scripts must understand their state. Any subsequent change to the system under test may result in the re-write or at worst obsolescence of test cases.

SUMMARY

According to one or more non-limiting embodiments of the present invention, a computer system comprises a processor in signal communication with a memory unit. A test case and recovery (TCR) system is configured to operate in a first mode to perform recovery and repair operations on the memory unit in response to detecting an error event and a second mode to perform test case analysis and verification of an operating system stored in the memory unit in response to being called by a test case.

According to one or more non-limiting embodiments of the present invention, a computer-implemented method comprises detecting, via a test case and recovery (TCR) system, an error event corresponding to a memory unit included in the computing system, and invoking a first mode of the TCR system to perform recovery and repair operations on the memory unit in response to detecting the error event. The method further comprises receiving, via the TCR system, a test case; and invoking a second mode of the TCR system to perform test case analysis and verification of an operating system stored in the memory unit in response to being called by a test case.

According to one or more non-limiting embodiments of the present invention, a computer program product comprises a computer readable storage medium having program instructions embodied therewith. The program instructions are executable by a processor to cause the processor to perform a method of testing a computing system. The method comprises detecting, via a test case and recovery (TCR) system, an error event corresponding to a memory unit included in the computing system, and invoking a first mode of the TCR system to perform recovery and repair operations on the memory unit in response to detecting the error event. The method further comprises receiving, via the TCR system, a test case; and invoking a second mode of the TCR system to perform test case analysis and verification of an operating system stored in the memory unit in response to being called by a test case.

BRIEF DESCRIPTION OF THE DRAWINGS

FIG. 3 is a process flow diagram illustrating operations performed in response to invoking a recovery verification routine according to a non-limiting embodiment;

FIG. 4 is a process flow diagram illustrating operations performed in response to invoking a recovery/repair mode or a test case analysis/verification routine mode of the testing system according to a non-limiting embodiment; and FIG. 5 is a process flow diagram illustrating monitoring operations during regression testing according to a non-limiting embodiment.

DETAILED DESCRIPTION

Black box testing and white box testing are two different approaches that are typically utilized to perform testing of a computer system. Black box testing is a methodology that maps the available inputs to an expected output without concern about the internal states that the system under test may go through to achieve the expected output. For example, a black box function test case for a numerical calculation unit may test for a specific numerical value given a valid mathematical expression. White Box testing, on the other hand, takes into consideration the internal state or sequence of states that the system under test goes through when determining whether the results are correct.

One problem associated with black box testing is determining the root cause of a defect. In particular black box testing will detect that the system has reached an observable erroneous state, but provides no information regarding the internal states the system entered to arrive at such a state. The more complex the system under test, the more important this drawback becomes.

White box testing may be able to provide early error detection, requiring less debug time for the analyst. Additionally, it may detect internally erroneous states that somehow never become observable through black box testing. However, white box testing comes at a cost. Opening up the internal states of the system under test means that the test scripts must understand their state. Any subsequent change to the system under test may result in the re-write or at worst obsolescence of test cases.

Various non-limiting embodiments described herein provide a test case and recovery (TCR) system that is capable of integrating together test case analysis results along with recovery and repair (recovery/repair) functionality. In at least one non-limiting embodiment, the TCR system can perform testing analysis and verification in response to receiving a test case input event, and can utilize a recovery function of the computer system's memory management system perform recovery/repair operation in response to detecting a system error event. A recovery processing module is provided that stores recovery code or a recovery routine to facilitate the recovery operation.

Unlike conventional systems, the recovery routine controlled by the recovery processing module can be invoked in response to one or more test cases. In addition, the recovery routine can be modified over time, but changes in the recovery routine do not impact or affect the test cases or inputs that invoke the recovery operation. In this manner, the computing system can utilize the recovery/repair operation to perform system verifications as opposed to relying solely on the test case module. Accordingly, the benefits of white box testing can be achieved using black box testing-type strategies because the internal state of the system remains encapsulated within the system and is not explicitly referenced in the test case.

Figure 1:
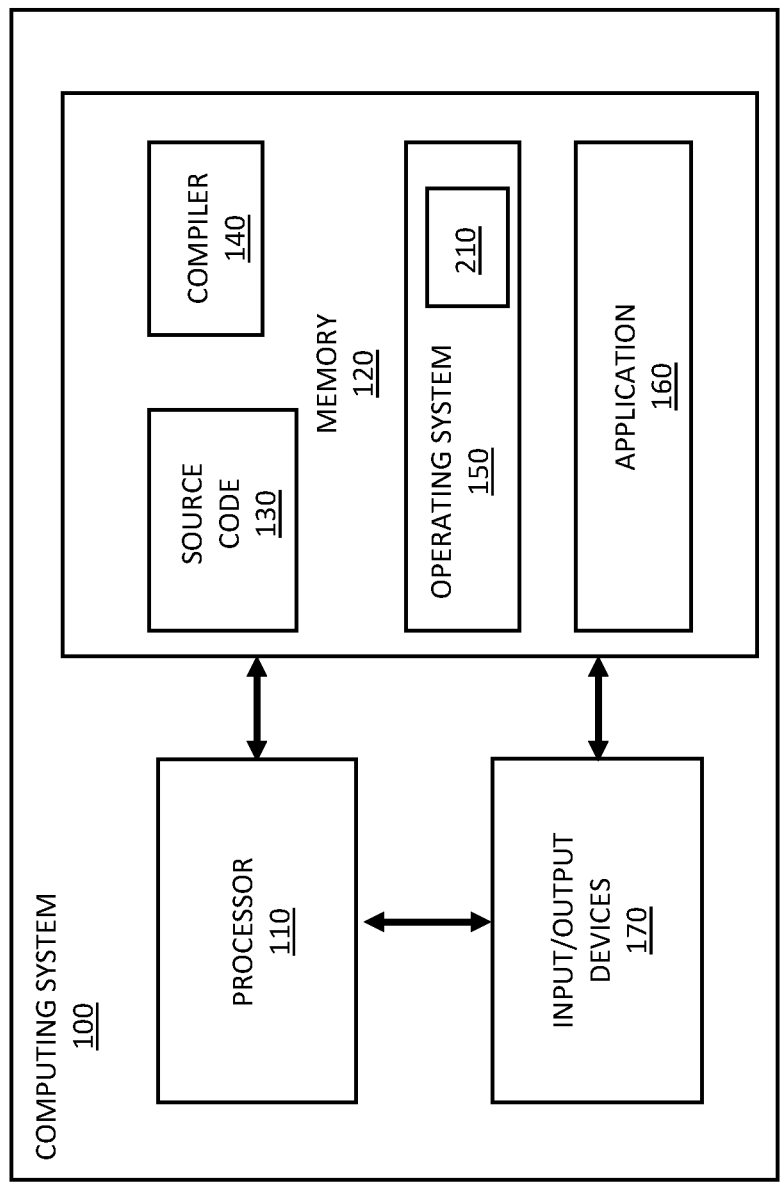
FIG. 1 is a block diagram of an example data computing system according to a non-limiting embodiment.

Turning now to FIG. 1, a data computing system 100 is generally shown in accordance with a non-limiting embodiment. The data computing system 100 includes, but is not limited to, PCs, workstations, laptops, PDAs, palm devices, servers, storages, and the like. Generally, in terms of hardware architecture, the data computing system 100 may include one or more processors 110 and one or more input/output (I/O) devices 170. The processors 120 and I/O devices 170 are in signal communication with a memory unit 120 via a local interface (not shown). The local interface can be, for example, but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 110 is a hardware device for executing software that can be stored in the memory 120. The processor 110 can be virtually any custom made or commercially available processor, a central processing unit (CPU), a digital signal processor (DSP), or an auxiliary processor among several processors associated with the data computing system 100, and the processor 110 may be a semiconductor based microprocessor (in the form of a microchip) or a macroprocessor.

The memory 120 can include any one or combination of volatile memory elements (e.g., random access memory (RAM), such as dynamic random access memory (DRAM), static random access memory (SRAM), etc.) and nonvolatile memory elements (e.g., ROM, erasable programmable read-only memory (EPROM), electronically erasable programmable read-only memory (EEPROM), programmable read only memory (PROM), tape, compact disc read-only memory (CD-ROM), disk, diskette, cartridge, cassette or the like, etc.). Moreover, the memory 120 may incorporate electronic, magnetic, optical, and/or other types of storage media. Note that the memory 120 can have a distributed architecture, where various components are situated remote from one another but can be accessed by the processor 110.

The software in the memory 120 may include one or more separate programs, each of which comprises an ordered listing of executable instructions for implementing logical functions. The software in the memory 120 includes a suitable operating system (O/S) 150, compiler 140, source code 130, and one or more applications 160 in accordance with exemplary embodiments. As illustrated, the application 160 comprises numerous functional components for implementing the features and operations of the exemplary embodiments. The application 160 of the data computing system 100 may represent various applications, computational units, logic, functional units, processes, operations, virtual entities, and/or modules in accordance with exemplary embodiments, but the application 160 is not meant to be a limitation.

The O/S 150 controls the execution of other computer programs, and provides scheduling, input-output control, file and data management, memory management, and communication control and related services. It is contemplated by the inventors that the application 160 for implementing exemplary embodiments may be applicable on all commercially available operating systems.

In one or more embodiments, the O/S 150 includes a recovery processing module 210. The recovery processing module 210 is configured to perform a verification and recovery function to ensure that the memory management function of the operating system is still in valid state. In one or more embodiments, the recovery processing module 210 is configured to operate in different modes. For example, the recovery processing module 210 can operate in a first mode (e.g., a recovery/repair mode) in response to the system detecting a system or memory error, and a second mode (e.g., a test case analysis/verification mode) in response to being called by a test case.

The recovery/repair mode performed by the recovery processing module 210 is facilitated using one or more recovery routines that are invoked in response to detecting an error condition. For example, the recovery processing module 210 stores a recovery routine that can react to a detected error condition by first verifying a portion of the memory or a memory data structure(s) associated with the detected error, and if necessary, can perform one or more repair and corrective actions. The repair and corrective actions can include, but are not limited to, marking a page as "data lost" and/or terminating an address space. The recovery processing module 210 can also record the error and/or the taken corrective action so that the error can be subsequently diagnosed. For example, the recovery processing module 210 can verify the Region, Segment and Page tables (collectively called Dynamic Address Translation or DAT tables). When a DAT table entry is found to be in error, the recovery processing module 210 can record the address and contents of the erroneous entry, and then terminate the erroneous address space.

The test case analysis/verification mode of the recovery processing module 210 can be invoked in response to receiving test case input rather than detecting an error condition. By invoking the recovery processing module 210, a test case can determine whether the verification processing of the recovery processing module 210 is operating correctly, or whether the system that module 210 is validating has reached an invalid state. In this manner, the internal structures of the O/S 150 can remain internal since the test case is utilizing the operating system's recovery processing module 210 to verify itself.

Application 160 may be a source program, executable program (object code), script, or any other entity comprising a set of instructions to be performed. When a source program, then the program is usually translated via a compiler (such as the compiler 140), assembler, interpreter, or the like, which may or may not be included within the memory 120, so as to operate properly in connection with the O/S 150. Furthermore, the application 160 can be written as an object oriented programming language, which has classes of data and methods, or a procedure programming language, which has routines, subroutines, and/or functions, for example but not limited to, C, C++, C#, Pascal, BASIC, API calls, HTML, XHTML, XML, ASP scripts, FORTRAN, COBOL, Perl, Java, ADA, .NET, and the like.

The I/O devices 170 may include input devices such as, for example, but not limited to, a mouse, keyboard, scanner, microphone, camera, etc. Furthermore, the I/O devices 170 may also include output devices, for example, but not limited to a printer, display, etc. Finally, the I/O devices 170 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 170 also include components for communicating over various networks, such as the Internet or intranet.

If the data computing system 100 is a PC, workstation, intelligent device or the like, the software in the memory 120 may further include a basic input output system (BIOS) (omitted for simplicity). The BIOS is a set of essential software routines that initialize and test hardware at startup, start the O/S 150, and support the transfer of data among the hardware devices. The BIOS is stored in some type of read-only-memory, such as ROM, PROM, EPROM, EEPROM or the like, so that the BIOS can be executed when the data computing system 100 is activated.

When the data computing system 100 is in operation, the processor 110 is configured to execute software stored within the memory 120, to communicate data to and from the memory 120, and to generally control operations of the data computing system 100 pursuant to the software. The application 160 and the O/S 150 are read, in whole or in part, by the processor 110, and may be buffered within the processor 110, and then executed.

When the application 160 is implemented in software it should be noted that the application 160 can be stored on virtually any computer readable medium for use by or in connection with any computer related system or method. In the context of this document, a computer readable medium may be an electronic, magnetic, optical, or other physical device or means that can contain or store a computer program for use by or in connection with a computer related system or method.

The application 160 can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the instruction execution system, apparatus, or device. The computer readable medium can be, for example, but not limited to, an electronic, magnetic, optical, electromagnetic, infrared, or semiconductor system, apparatus, device, or propagation medium.

More specific examples (a nonexhaustive list) of the computer-readable medium may include the following: an electrical connection (electronic) having one or more wires, a portable computer diskette (magnetic or optical), a random access memory (RAM) (electronic), a read-only memory (ROM) (electronic), an erasable programmable read-only memory (EPROM, EEPROM, or Flash memory) (electronic), an optical fiber (optical), and a portable compact disc memory (CDROM, CD R/W) (optical). Note that the computer-readable medium could even be paper or another suitable medium, upon which the program is printed or punched, as the program can be electronically captured, via for instance optical scanning of the paper or other medium, then compiled, interpreted or otherwise processed in a suitable manner if necessary, and then stored in a computer memory.

In exemplary embodiments, where the application 160 is implemented in hardware, the application 160 can be implemented with any one or a combination of the following technologies, which are well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Figure 2:
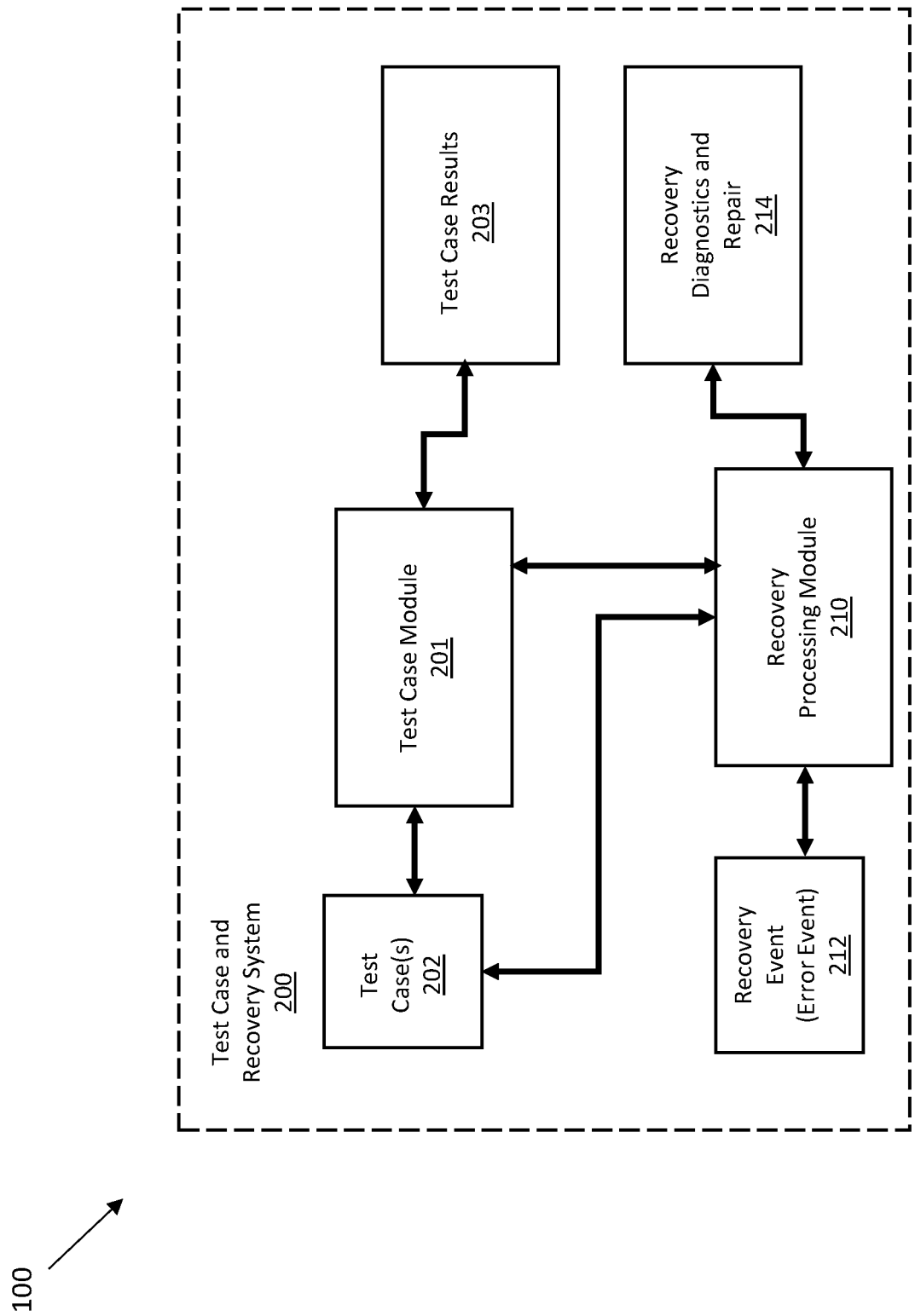
FIG. 2 is a block diagram of a testing system employed in a computer system according to a non-limiting embodiment.

Turning now to FIG. 2, a test case and recovery (TCR) system 200 is illustrated according to a non-limiting embodiment. The TCR system 200 includes a test case module 201 and a recovery processing module 210. The TCR system can implement a system recovery component referred to as a Recovery Termination Manager (RTM). The RTM receives control when some type of error occurs such as writing to unallocated storage.

The test case module 201 interacts with one or more test cases 202, which can be executed thereon. A test case such as test case 202 may indicate one or more O/S elements or structures to be diagnosed and verified. Accordingly, executing the test case 202 can generate one or more test case results 203. In one or more embodiments, the test case results 203 may include a test case results file that contains one or more result entries, each result entry including a respective result description. Each entry describes possible results that may be received from a test case such as test case 202. A result description may describe a result using any appropriate data, and a result may be determined to be listed in result description file based on one or multiple aspects of the result. The data that is included in a result description may include, but is not limited to, one or more of the following: an identification of the function under test by the test case; an error code; a return code; a reason code; a message number; message text or symptom included in message; creation of a dump, including the dump title and/or symptoms; creation of a record in an error log; output data; and log data. The test case module 201 can search the result descriptions in result description file using data from a received result from test case 202 to identify one or more specific results generated in response to executing the test case 202.

In one or more embodiments, the recovery processing module 210 is programmed with a test case parameter list, which serves as input parameters that will invoke the analysis/verification mode using the test case 202. In at least one embodiment, the test case parameter list indicates one or more structures that are targeted for verification.

In one or more embodiments, the test case 202 can include one or more function test cases, which are written to issue some sequence of external functions and at various points of their execution, invoke a verification and recovery function performed by the recovering processing module 210 to ensure that the memory management function of the operating system is still in valid state. In this manner, the operating system's internal structures remain internal since the test case 202 is using the operating system's verification and recovery function to verify itself.

The recovery processing module 210 can operate differently in response to receiving a test case 202 compared to being invoked from the system when an error is detected. For example, in response to invoking the analysis/verification mode (e.g., in response to a test case) the recovery processing module 210 aims to generate test case results 203 capable of diagnosing a problem, and/or recording error and trace information describing how the error occurred, whereas in response to invoking the recovery mode the recovery processing module 210 aims to perform the recovery diagnostics and repair operations 214. The recovery diagnostics and repair operations 214 can include, for example, correcting and logging memory elements, terminating erroneous address space, etc.

Turning now to FIG. 3, FIG. 4 and FIG. 5, various flow process diagrams illustrate operations performed by the test case and recovery (TCR) system 200 are illustrated according to non-limiting embodiments. Referring to FIG. 3, the test case and recovery system 200 can execute a recovery verification routine in response to invoking a system recovery (1) or in response to receiving a test case (2). As mentioned above, the TCR system 200 can implement a RTM, which receives control when some type of error occurs such as writing to unallocated storage.

Executing a recovery verification routine involves performing a battery of diagnostic tests (e.g., Test 1, Test 2, etc.). In one or more embodiments, the recovery processing module 210 included in the O/S 150 can selectively perform the recovery verification routine based on whether a recovery event (1) is detected or whether a test case (2) is received.

As shown in FIG. 4, the recovery processing module 210 performs different actions based on whether the error was detected during the course of normal system operation (1), or whether the error was detected following execution of a diagnostic test associated with a test case (2).

When the error was detected during normal system operation (1) (see FIG. 3), the recovery processing module 210 invokes the recovery/repair mode and records the error (5), e.g., records the address and contents of the erroneous entry. The recovery processing module 210 also performs one or more recovery actions (6), before returning to the caller (7) when invoked the recovery/repair mode. The recovery actions 6 can include, but are not limited to, marking a page as "data lost" and/or terminating an address space.

When the error was detected following execution of a diagnostic test associated with the test case (2) (see FIG. 3), the recovery processing module 210 invokes the test case analysis/verification mode. Accordingly, the recovery processing module 210 records the error (8) and returns to the caller (9) (e.g., Test 1) when invoked in the recovery/repair mode. When operating in the invoked test case analysis/verification mode, recording the error (8) includes capturing sufficient documentation to diagnose the problem that caused the error, rather than recording the address and contents of the erroneous entry for performing recovery and repair according to the recovery/repair mode.

At FIG. 5, the testing system 200 also performs a monitoring regression test that periodically invokes a different recovery verification. For example, the periodic recovery verification steps shown in FIG. 5 are invoked by a test case, which calls an internal routine that obtains serialization and verifies the data structures for each active address space in the system that is under test. The verification includes checking the integrity of the data structures as well the counts corresponding to these data structures. When any inconsistency is detected, the monitor routine raises an error condition and optionally halts the system so that the necessary data can be captured to debug the cause of the inconsistency.

Embodiments can be a system, a method, and/or a computer program product. The computer program product can include a computer-readable storage medium (or media) having computer-readable program instructions thereon for causing a processor to carry out aspects of embodiments of the present invention.

The computer-readable storage medium can be a tangible device that can retain and store instructions for use by an instruction execution device. The computer-readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers, and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out embodiments can include assembler instructions, instruction-set-architecture (ISA) instructions, machine instructions, machine dependent instructions, microcode, firmware instructions, state-setting data, or either source code or object code written in any combination of one or more programming languages, including an object-oriented programming language such as Smalltalk, C++ or the like, and conventional procedural programming languages, such as the "C" programming language or similar programming languages. The computer-readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer-readable program instructions by utilizing state information of the computer-readable program instructions to personalize the electronic circuitry, in order to perform embodiments of the present invention.

Aspects of various embodiments are described herein with reference to flowchart illustrations and/or block diagrams of methods, apparatus (systems), and computer program products according to various embodiments. It will be understood that each block of the flowchart illustrations and/or block diagrams, and combinations of blocks in the flowchart illustrations and/or block diagrams, can be implemented by computer-readable program instructions. These computer-readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions can also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowchart and/or block diagram block or blocks. The computer-readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The present techniques may be a system, a method or an apparatus. The flowchart and block diagrams in the Figures illustrate the architecture, functionality, and operation of possible implementations of systems, methods, and apparatus according to various embodiments of the present techniques. In this regard, each block in the flowchart or block diagrams may represent a module, segment, or portion of logic for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present techniques have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computing system comprising:
   a processor in signal communication with a memory unit; and
   a test case and recovery (TCR) system configured to operate in a first mode to perform recovery and repair operations on the memory unit in response to detecting an error event and a second mode to perform test case analysis and verification of an operating system stored in the memory unit in response to being called by a test case.

2. The computing system of claim 1, wherein the error event includes a detected error occurring in the memory unit, and wherein the test case indicates at least one element of the operating system to be analyzed and verified.

3. The computing system of claim 1, wherein the TCR system includes a recovery processing module included in the operating system, the recovery processing module configured to selectively perform the recovery and repair operations and the test case analysis and verification.

4. The computing system of claim 1, wherein the recovery and repair operations further include one or both of marking a page in the memory unit to indicate data lost from the page and terminating an address space of the page.

5. The computing system of claim 1, wherein the recovery and repair operations include recording an address and contents of an erroneous entry in the memory unit, and wherein the test case analysis and verification includes capturing data to diagnose an error detected in response performing the test case analysis and verification.

6. A computer-implemented method to test a computing system, the method comprising:
   detecting, via a test case and recovery (TCR) system, an error event corresponding to a memory unit included in the computing system;
   invoking a first mode of the TCR system to perform recovery and repair operations on the memory unit in response to detecting the error event;
   receiving, via the TCR system, a test case; and
   invoking a second mode of the TCR system to perform a test case analysis and verification of an operating system stored in the memory unit in response to being called by the test case.

7. The computer-implemented method of claim 6, wherein the error event includes a detected error occurring in the memory unit, and wherein the test case indicates at least one element of the operating system to be analyzed and verified.

8. The computer-implemented method of claim 6, further comprising selectively performing, via a recovery processing module included in the operating system, the recovery and repair operations and the test case analysis and verification.

9. The computer-implemented method of claim 6, wherein the recovery and repair operations comprise one or both of marking a page in the memory unit to indicate data lost from the page and terminating an address space of the page.

10. The computer-implemented method of claim 6, wherein the recovery and repair operations further comprise recording an address and contents of an erroneous entry in the memory unit, and wherein the test case analysis and verification comprises capturing data to diagnose an error detected in response performing the test case analysis and verification.

11. A computer program product comprising:
a computer readable storage medium having program instructions embodied therewith, the program instructions executable by a processor to cause the processor to perform a method of testing a computing system, the method comprising:
detecting, via a test case and recovery (TCR) system, an error event corresponding to a memory unit included in the computing system;
invoking a first mode of the TCR system to perform recovery and repair operations on the memory unit in response to detecting the error event;
receiving, via the TCR system, a test case; and
invoking a second mode of the TCR system to perform a test case analysis and verification of an operating system stored in the memory unit in response to being called by the test case.

12. The computer program product of claim 11, wherein the error event includes a detected error occurring in the memory unit, and wherein the test case indicates at least one element of the operating system to be analyzed and verified.

13. The computer program product of claim 11, further comprising selectively performing, via a recovery processing module included in the operating system, the recovery and repair operations and the test case analysis and verification.

14. The computer program product of claim 11, wherein the recovery and repair operations comprise one or both of marking a page in the memory unit to indicate data lost from the page and terminating an address space of the page.

15. The computer program product of claim 11, wherein the recovery and repair operations further comprise recording an address and contents of an erroneous entry in the memory unit, and wherein the test case analysis and verification comprises capturing data to diagnose an error detected in response performing the test case analysis and verification.

\* \* \* \* \*